United States Patent
Steinle et al.

[11] Patent Number: 5,876,538
[45] Date of Patent: Mar. 2, 1999

[54] METHOD FOR MANUFACTURING A CERAMIC MULTILAYER SUBSTRATE FOR COMPLEX ELECTRONIC CIRCUITS

[75] Inventors: Klaus Steinle, Sindelfingen; Claudio De La Prieta, Stuttgart; Manfred Moser, Reutlingen-Sickenhausen; Annette Seibold, Rutesheim, all of Germany

[73] Assignee: Robert Bosch GmbH, Stuttgart, Germany

[21] Appl. No.: 805,524

[22] Filed: Feb. 26, 1997

[30] Foreign Application Priority Data

Mar. 9, 1996 [DE] Germany ............... 1 96 09 2213

[51] Int. Cl.$^6$ ............... B32B 31/26; H01G 4/12; H01G 4/224
[52] U.S. Cl. ............... 156/89.16; 156/89.14; 156/89.17; 156/89.19; 156/89.21; 29/25.42; 361/321.1; 361/762; 361/763
[58] Field of Search ............... 156/89.12, 89.14, 156/89.16, 89.17, 89.21, 89.19; 264/614, 615, 619; 29/851, 25.42; 361/301.3, 321.1, 761, 762, 763

[56] References Cited

U.S. PATENT DOCUMENTS

| | | |
|---|---|---|
| 4,800,459 | 1/1989 | Takagi et al. . |
| 5,027,253 | 6/1991 | Lauffer et al. ............... 361/321.1 |
| 5,034,850 | 7/1991 | Hernandez et al. . |
| 5,144,526 | 9/1992 | Vu et al. . |
| 5,573,808 | 11/1996 | Gruenwald et al. ........... 361/321.1 X |
| 5,590,017 | 12/1996 | Kelso . |
| 5,661,882 | 9/1997 | Alexander ............... 29/25.42 |
| 5,708,570 | 1/1998 | Polinsk, Sr. ............... 361/762 |

FOREIGN PATENT DOCUMENTS

| | | |
|---|---|---|
| 0 300 186 B1 | 1/1989 | European Pat. Off. . |
| 43 36 235 A1 | 4/1995 | Germany . |
| 0212392 | 5/1990 | Japan . |
| 03191596 | 8/1991 | Japan . |
| 4-177712 | 6/1992 | Japan . |
| 2 186 435 | 8/1987 | United Kingdom . |
| 2 213 642 | 8/1989 | United Kingdom . |

Primary Examiner—Curtis Mayes
Attorney, Agent, or Firm—Kenyon & Kenyon

[57] ABSTRACT

Ceramic multilayer substrates as circuit supports for complex electronic circuits wth integrated capacitors are manufactured by printing capacitor structures, using the screen printing process, directly onto a first green ceramic film. The first green ceramic film with the printed structures is arranged in a stack with further green ceramic films, laminated, and fired. During lamination of the ceramic films, the printed structures are pressed into the ceramic films so that after firing, a multilayer substrate with integrated capacitors results.

7 Claims, 3 Drawing Sheets

METHOD FOR MANUFACTURING A CERAMIC MULTILAYER SUBSTRATE FOR COMPLEX ELECTRONIC CIRCUITS

FIELD OF THE INVENTION

The present invention relates to a method for manufacturing ceramic multilayer substrates that are provided as circuit supports for complex electronic circuits.

BACKGROUND INFORMATION

A method of this kind for manufacturing ceramic multilayer substrates provided as circuit supports for complex electronic circuits is shown in European Patent Application No. 300 186. A conductive metal pattern and a coating made of an organic material are printed, using the screen printing process, onto a green ceramic film, i.e., an unfired ceramic film in the raw state. The structures are first pressed into the green ceramic film. The green ceramic film is then arranged in a stack together with further green ceramic films, laminated, and fired.

German Patent Application No. DE 43 36 235 shows a method for manufacturing ceramic multilayers which allows the configuration of capacitors in a ceramic multilayer substrate. In this method a first green ceramic film is equipped, before stacking, with punched holes (called "vias") that are filled with a capacitor paste, and electrodes are then printed above and below the vias using the screen printing process. The first green ceramic film, together with further green ceramic films which have the structures for conductive paths and through contacts, is then stacked, laminated, and fired.

The method shown in German Patent Application No. DE 43 36 235 for configuring capacitors in a ceramic multilayer has the disadvantage that the vias filled with the capacitor paste always extend through the thickness of the entire ceramic film, so that the dielectric layer between the two electrodes of the capacitor becomes relatively thick and cannot be defined as desired. In addition the electrode surfaces are only partly occupied by the filled vias, so that for this reason as well the capacitance of the resulting capacitor cannot be freely adjusted.

SUMMARY OF THE INVENTION

The method according to the present invention has, in contrast, the advantage that in a ceramic multilayer substrate for complex electronic circuits, integrated capacitors with high capacitances can be manufactured with known process techniques; the capacitances can easily be adjusted by altering the size of the surface area of the applied electrodes, and by altering the thickness of the dielectric intermediate layer. Because the electrode material and in particular the dielectric are encapsulated in the interior of the multilayer substrate, the capacitor structures are well protected against the penetration of moisture and any associated deterioration in dielectric properties.

The capacitor structures can be manufactured, in space-saving fashion, at any desired location in the multilayer circuit; it is not necessary to use an additional ceramic film equipped with vias, as in German Patent Application No. DE 43 36 235. It may further be regarded as advantageous that the structures do not need first to be produced on a support and then pressed into the ceramic films, but are applied directly onto the ceramic films.

According to the present invention, for example, using low-sintering ceramic films has the advantage that in the manufacture of the multilayer substrate, particularly economical silver metallizing substances can be used for the conductor paths and through contacts of the electronic circuit of the multilayer substrate.

Another embodiment of the present invention has the advantage, as compared with the method disclosed in European Patent Application No. 300 186, that the structures do not need to be additionally pressed in before the ceramic films are stacked and laminated. The structures, printed onto a ceramic film, are not pressed in between the ceramic films until after aligned arrangement of the ceramic films during lamination with the laminating press. A particular advantage here is that the previously known process step of laminating the ceramic films can be retained unchanged.

The additional pressing of the structures into the first green ceramic film before stacking of the ceramic films, in another embodiment of the present invention, has the further advantage that any air inclusions which may be present in the dielectric paste are pressed out of the paste and the flatness of the multilayer substrate is increased.

The stamping operation in another embodiment of the present invention further increases the flatness of the substrate; even large dielectric layers can be manufactured between the electrodes without impairing the stability of the ceramic film by a punching operation as in the case of the method disclosed in German Patent Application No. DE 43 36 235. In still another embodiment of the present invention, additional pressing of the structures into the previously stamped depression yields even better flatness in the manufactured multilayer substrate, and at the same time prevents the formation of shrinkage cavities in the dielectric.

In still another embodiment of the present invention, the configuration of the first electrode as a large-area substance plane has the advantage that an additional process step for manufacturing the first electrode is not necessary, since a substance plane of this kind is provided in any case in many ceramic multilayer substrates provided as circuit supports for electronic circuits.

A further advantage of the present invention is the fact that the structures applied onto the ceramic films can be manufactured using the screen printing process.

DETAILED DESCRIPTION OF THE INVENTION

Figure 1:
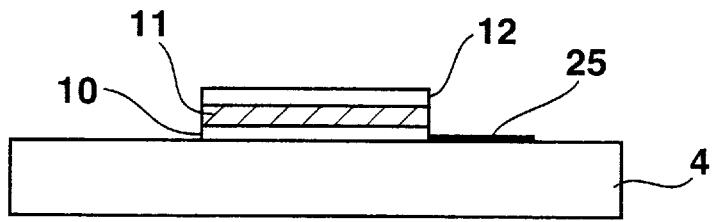
FIG. 1 shows a front view of a green ceramic film and capacitor structures in a first exemplified embodiment according to the present invention.
Figure 2:
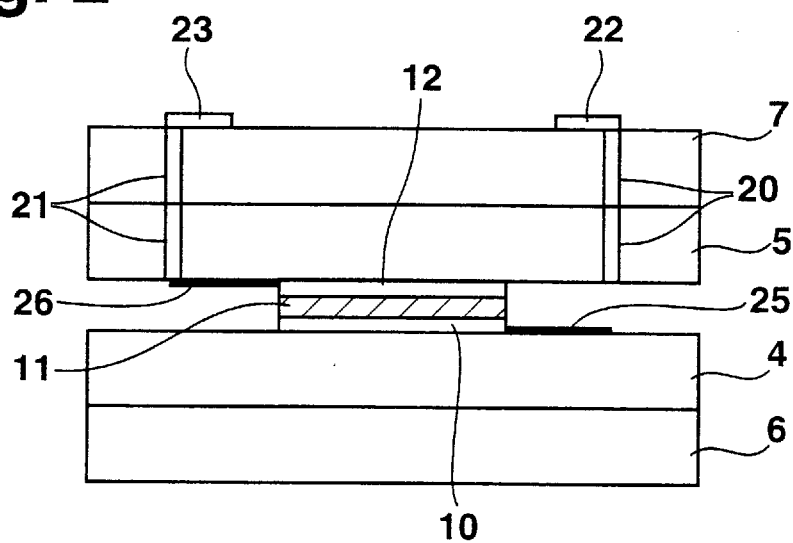
FIG. 2 shows a front view of a stack of green ceramic films and capacitor structures in a first exemplified embodiment according to the present invention.
Figure 3:
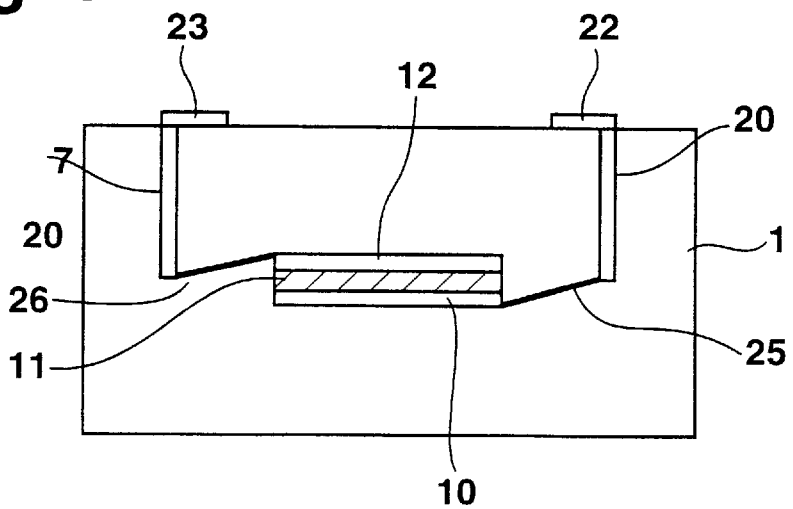
FIG. 3 shows a front view of a multilayer substrate in a first exemplified embodiment according to the present invention.

A first exemplified embodiment of the method according to the present invention for manufacturing ceramic multilayer substrates which are provided as circuit supports for complex electronic circuits is depicted in FIGS. 1 to 3. The depiction of the ceramic circuit support is here reduced to the components required for the present invention. The complex conductor path pattern of the electronic circuit, the many through contacts provided in the multilayer substrate to connect various conductor planes, and further electronic components such as resistors, are not depicted in the interest of clarity. In addition, FIGS. 1 to 7 depict only one capacitor provided in a multilayer substrate. It is self-evident that in a multilayer substrate for complex, multiple-layer electronic circuits, a plurality of such capacitors are provided, connected in electrically conductive fashion via conductor paths and through contacts to further components provided on the ceramic films.

FIG. 1 shows a first green ceramic film 4, in particular an unfired glass ceramic film which is made of a low-sintering glass ceramic material. As shown in FIG. 1, a first electrode 10 is first printed onto first green ceramic film 4 by screen printing. Conductor paths 25 that are applied together with electrode 10 in one printing step, and that are connected in conductive fashion to electrode 10, can also be provided on first green ceramic film 4. In addition, further conductor paths (not depicted) belonging to a different part of the complex electronic circuit can also be printed on.

Then, in a second printing step using the screen printing process, a dielectric paste 11, made of a material which has a high dielectric constant after firing, is printed onto first electrode 10. Pastes which contain barium titanate as the milled solid and form porous layers with a high dielectric constant after firing can, for example, be used for this. The dielectric paste can also, if necessary, be applied onto first electrode 10 in multiple printing steps, so as thereby to produce a somewhat thicker dielectric layer 11. This may be necessary, for example, in order to increase the breakdown strength of dielectric layer 11. Then second electrode 12, and optionally conductor path connections (not depicted in the Figure), are printed onto dielectric paste 11 using the screen printing process. It has proven to be advantageous in this regard to use a thick-film paste made of silver as the electrode material. Thick-film pastes made of silver-palladium or gold can, however, also be used. With higher firing temperatures, pastes containing molybdenum or tungsten can also be used as electrode material.

Then, as shown in FIG. 2, first green ceramic film 4 with printed-on structures 10, 11, 12 is arranged in a stack with further green ceramic films 5, 6, 7 (only three of which are depicted in FIG. 2), aligned above one another, a second green ceramic film 5 being laid onto the printed-on structures. First green ceramic film 4 does not necessarily need to be arranged in the center of the stack. It is also possible, for example, to arrange first green ceramic film 4 at any other position in the stack. The further ceramic films 5, 6, 7 have through contacts 20, 21, conductor paths 25, 26, and connection contacts 22, 23, which are intended to be connected in conductive fashion to the electrodes of the capacitor. Furthermore, ceramic films 4, 5, 6, and 7 can also contain further structures not depicted in FIG. 2, for example further conductor paths or through contacts of the electronic circuit provided on the multilayer substrate.

After the ceramic films are stacked, they are laminated, the individual ceramic films being pressed together with a laminating press to form a multilayer substrate 1 shown in FIG. 3. At the same time, structures 10, 11, 12 constituting, for example, the capacitor are pressed into first ceramic film 4 and into second ceramic film 5. Then the resulting multilayer substrate 1 is fired in a sintering process in a manner as is known in the art. Multilayer substrate 1 manufactured in this fashion has in the interior, as depicted in FIG. 3, a capacitor structure, consisting of, for example, first electrode 10, dielectric layer 11, and second electrode 12, that is well protected against the penetration of moisture. This is of particular significance because after firing, dielectric paste 11 forms a porous layer with a high dielectric constant, and the penetration of moisture into the porous layer could destroy the capacitor. Contact with electrodes 10, 12 is made by connection contacts 22, 23, through contacts 20, 21, and conductor paths 25, 26.

The manufacturing method according to the present invention described so far can be further improved by the fact that structures 10, 11, 12, printed onto first green ceramic film 4 using the screen printing process, are partly pressed into first green ceramic film 4 in a further process step that is performed before the ceramic films are stacked. It is also possible to press dielectric paste 11 and first electrode 10 into ceramic film 4 before second electrode 12 is printed on, and only then to print on second electrode 12. The pressing operation can then optionally be repeated again. The additional pressing operation (not depicted in FIGS. 1 to 3) presses air inclusions out of dielectric paste 11, and thus increases the breakdown strength of the capacitor by yielding a dielectric layer 11 with few shrinkage cavities. The flatness of the structures is also further improved. The additional pressing operation can be performed with the laminating press that is already available as a tool in the manufacture of ceramic multilayer substrates.

Figure 4:
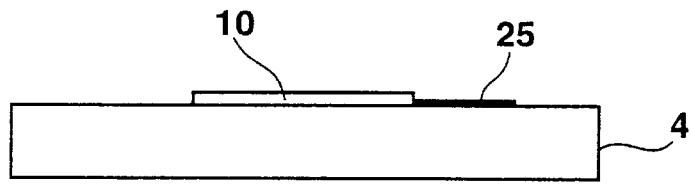
FIG. 4 shows a front view of a green ceramic film and a first electrode in a second exemplified embodiment of the manufacturing method according to the present invention.
Figure 5:
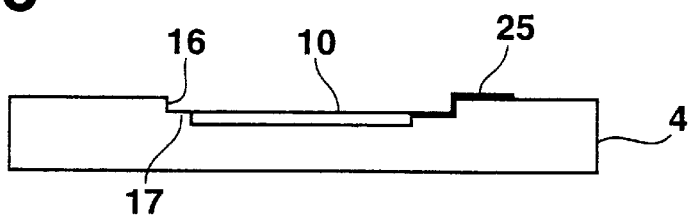
FIG. 5 shows a front view of a green ceramic film, a first electrode with a trough-shaped depression stamped into the surface of a ceramic film in a second exemplified embodiment of the manufacturing method according to the present invention.
Figure 6:
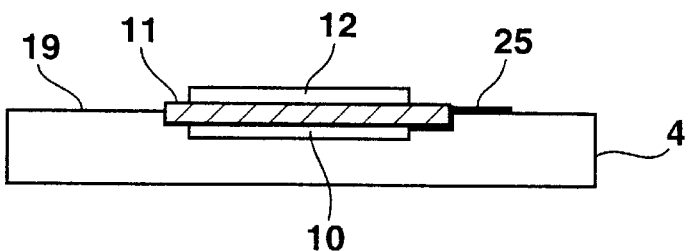
FIG. 6 shows a front view of a green ceramic film and capacitor structures in a second exemplified embodiment of the manufacturing method according to the present invention.

A further exemplified embodiment of the present invention is depicted in FIGS. 4 to 6. As shown in FIG. 4, once again a first electrode 10 is first printed onto a first green ceramic film 4 using the screen printing process. Conductor paths 25 for electrical connection of electrode 10 are again provided. The further conductor paths, through contacts, and other components of the electronic circuit are again not depicted in the Figure in the interest of clarity.

As depicted in FIG. 5, a trough-shaped depression 16, the bottom surface area of which is slightly greater than the electrode surface area of the capacitor to be manufactured, is then stamped with a die into first green ceramic film 4 at the location of the previously printed-on electrode 10, so that electrode 10 constitutes the bottom of trough-shaped depression 16 except for a narrow edge region 17. Stamping can be performed with an impression die simultaneously with heating of green ceramic film 4. It is also, in particular, possible to perform stamping with a laminating press.

Figure 7:
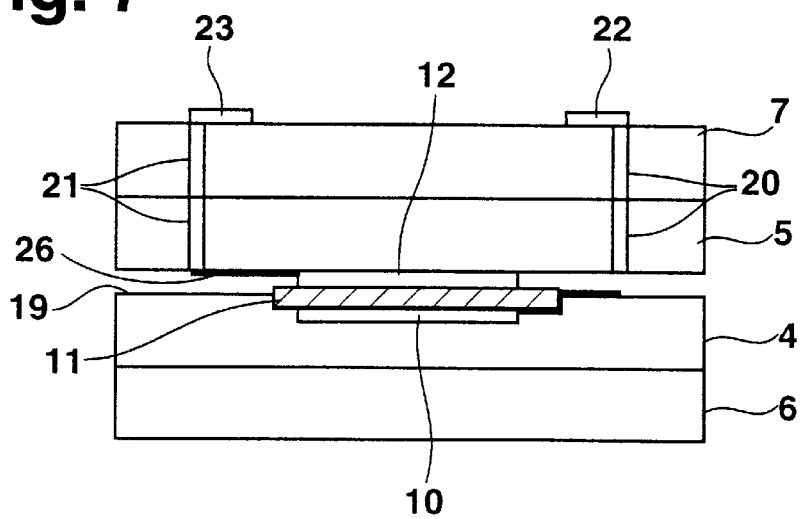
FIG. 7 shows a front view of a stack of green ceramic films in a second exemplified embodiment of the manufacturing method according to the present invention.

Then, as shown in FIG. 6, dielectric paste 11 is printed onto first electrode 10 in the region of trough-shaped depression 16 using a further screen-printing process. Dielectric paste 11 is printed on in such a way that it fills up the entire depression 16, but it can also project beyond trough-shaped depression 16. The printing operation can, if necessary, be repeated in order to increase the layer thickness of dielectric layer 11. Second electrode 12 is then printed onto dielectric layer 11 and, as depicted in FIG. 7, first green ceramic film 4 with the structures applied onto it is arranged in a stack with further ceramic films 5, 6, 7, and lastly laminated and fired.

During lamination, as in the first exemplified embodiment, capacitor structures 10, 11, 12 are pressed into first green ceramic film 4 and into second green ceramic film 5, which is in contact with the structures after stacking. The result of the previous stamping of trough-shaped depression 16 is that upon lamination, the resulting substrate is particularly flat.

It is also possible, before ceramic films 4, 5, 6 and 7 are stacked, to press a further trough-shaped depression (not shown in FIG. 7) into the underside of second green ceramic film 5. The stamping of depression 16 and the depression in the second green ceramic film can take place in one step, so that an additional process step is not required for this. Alternatively, stamping of first ceramic film 4 can also be omitted, and a depression can be stamped only into the underside of second green ceramic film 5. When the ceramic films are stacked, trough-shaped depression stamped into second green ceramic film 5 receives the portion of structures 10, 11, 12 that is elevated above top surface 19 of first ceramic film 4. When ceramic films 4, 5, 6, 7 are subsequently compressed in the laminating press, the flatness of the resulting substrate is thus improved.

It is moreover also possible, before the ceramic films are arranged in the stack, to press structures 10, 11, 12 at least partly into trough-shaped depression 16 in an additional pressing operation, so as thereby to press air inclusions out of the dielectric paste. This additional pressing operation prior to stacking of the ceramic films can take place either after dielectric paste 11 is printed on, or after second electrode 12 is printed on.

Figure 8:
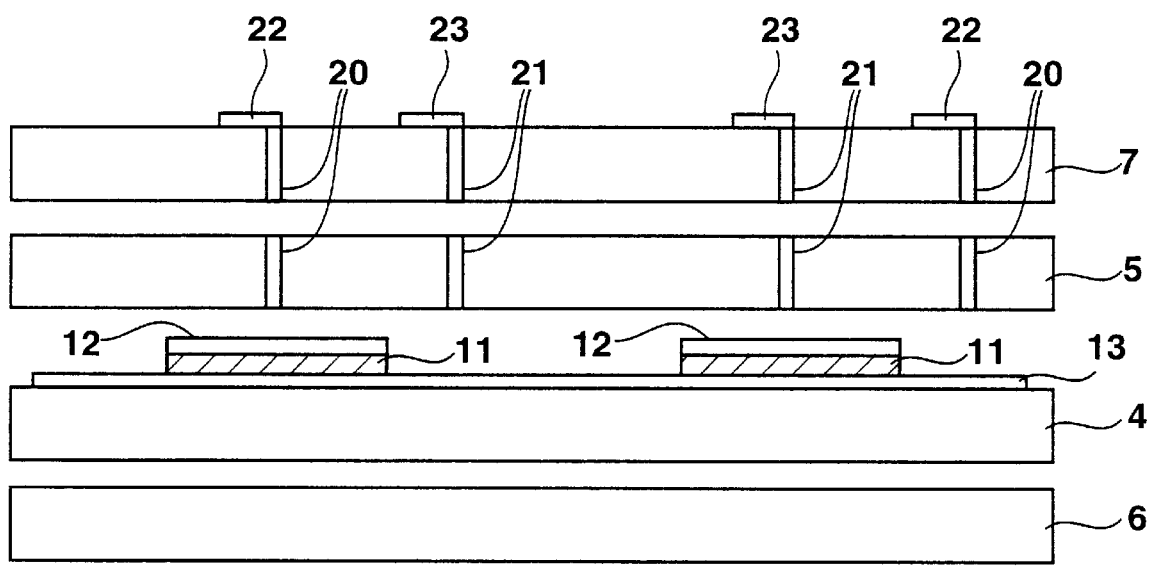
FIG. 8 shows a third exemplified embodiment according to the present invention with a large-area substance plane as the first electrode.

A third exemplified embodiment of the present invention is shown in FIG. 8 in the form of an exploded depiction. Here a large-area substance plane 13 is first applied onto first green ceramic film 4. Then, at at least one point, a dielectric paste 11 is applied in a limited region onto substance plane 13 by screen printing. The size of dielectric layer 11 corresponds approximately to the size of the capacitor being manufactured. In order to manufacture multiple capacitors in one process step, dielectric paste 11 is applied at several different points on substance plane 13 in one screen-printing step. Then a second electrode 12 is printed onto each dielectric layer 11. This can once again be accomplished using the screen printing method in one printing step.

Multiple capacitor structures can also be constituted in this manner. The first electrode of each of these capacitors is constituted by the portion of large-area substance plane 13 that has had dielectric layers 11 printed onto it. As constituents of substance plane 13, the first electrodes of the capacitors manufactured in this fashion are all interconnected in electrically conductive fashion. Then the first green ceramic film is again arranged in a stack with further ceramic films 5, 6, and 7, the further ceramic films containing through contacts 20, 21 and connection contacts 22, 23. In addition, the ceramic films have further structures belonging to the electronic circuit (not shown in FIG. 8), for example conductor paths, through contacts, and other electronic components. After stacking, laminating, and firing of the ceramic films, contact is made with the two electrodes of the resulting capacitor structures by means of connection contacts 22 and 23 and through contacts 20 and 21.

What is claimed is:

1. A method for manufacturing a ceramic multilayer substrate that is provided as a circuit support for complex electronic circuits, comprising the steps of:

applying a plurality of structures directly onto a first green ceramic film, the plurality of structures including at least one capacitor, wherein each capacitor includes a first electrode, a dielectric paste and a second electrode, the applying step including the substeps of:
   applying the first electrode onto the first green ceramic film,
   stamping a trough-shaped depression into the first green ceramic film, the bottom of the trough-shaped depression being formed at least partly by the first electrode,
   applying a dielectric paste onto the first electrode so that the dielectric paste fills the trough-shaped depression, and
   applying the second electrode onto the dielectric paste;

arranging the first green ceramic film in a stack with a second green ceramic film, a third green ceramic film and a fourth green ceramic film;

laminating the stack of green ceramic films;

after the arranging step and when the stack is laminated, pressing each of the plurality of structures into the first green ceramic film and into the second green ceramic film; and firing the stack of green ceramic films.

2. The method according to claim 1, wherein the green ceramic films include low-sintering ceramic films.

3. The method according to claim 2, wherein the low-sintering ceramic films include glass ceramic films.

4. The method according to claim 1, further comprising the step of stamping a second trough-shaped depression into an underside of the second green ceramic film, the second trough-shaped depression receiving a portion of the plurality of structures extending above a top surface of the first green ceramic film when the second green ceramic film rests on the plurality of structures after stacking of the ceramic films.

5. The method according to claim 1, further comprising the step of, before the step of arranging the green ceramic films into a stack, pressing the plurality of structures at least partly into the trough-shaped depression in the first green ceramic film.

6. The method according to claim 1, wherein the first electrode is applied onto the first green ceramic film as a large-area substance plane.

7. The method according to claim 1, wherein each of the plurality of structures is printed onto the first green ceramic film using a screen printing process.

* * * * *